(12) United States Patent
Stahl et al.

(10) Patent No.: US 9,206,034 B2
(45) Date of Patent: Dec. 8, 2015

(54) MICROMECHANICAL COMPONENT HAVING A BOND JOINT

(71) Applicants: Heiko Stahl, Reutlingen (DE); Christoph Duenn, Reutlingen (DE); Hans-Peter Baer, Pfullingen (DE)

(72) Inventors: Heiko Stahl, Reutlingen (DE); Christoph Duenn, Reutlingen (DE); Hans-Peter Baer, Pfullingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 14/058,550

(22) Filed: Oct. 21, 2013

(65) Prior Publication Data
US 2014/0117471 A1 May 1, 2014

(30) Foreign Application Priority Data
Oct. 26, 2012 (DE) .......................... 10 2012 219 616

(51) Int. Cl.
*B81B 7/00* (2006.01)

(52) U.S. Cl.
CPC .................................. *B81B 7/0006* (2013.01)

(58) Field of Classification Search
CPC .................................................. H01H 59/0009
USPC ........... 257/254, 415, 420, E21.306; 438/51, 438/55, 64, 106
See application file for complete search history.

(56) References Cited

U.S. PATENT DOCUMENTS

| 2004/0195638 A1* | 10/2004 | Fischer et al. ................ 257/417 |
| 2005/0253240 A1* | 11/2005 | Nuechter et al. .............. 257/686 |
| 2008/0119002 A1* | 5/2008 | Grosjean et al. ................ 438/50 |
| 2008/0164564 A1* | 7/2008 | Stahl et al. .................... 257/532 |
| 2011/0079079 A1* | 4/2011 | Classen et al. ............. 73/504.12 |

* cited by examiner

*Primary Examiner* — Karen Kusumakar
*Assistant Examiner* — Adam S Bowen
(74) *Attorney, Agent, or Firm* — Kenyon & Kenyon LLP

(57) ABSTRACT

A micromechanical component includes a substrate and a first oxide layer on the substrate, the first oxide layer having an aperture. The component further includes a conductive functional layer, which is provided on the first oxide layer in the region of the aperture, and a metal layer, which is provided on the functional layer, for producing a bond joint. A second oxide layer is provided on lateral faces of the functional layer for insulating the functional layer.

14 Claims, 6 Drawing Sheets

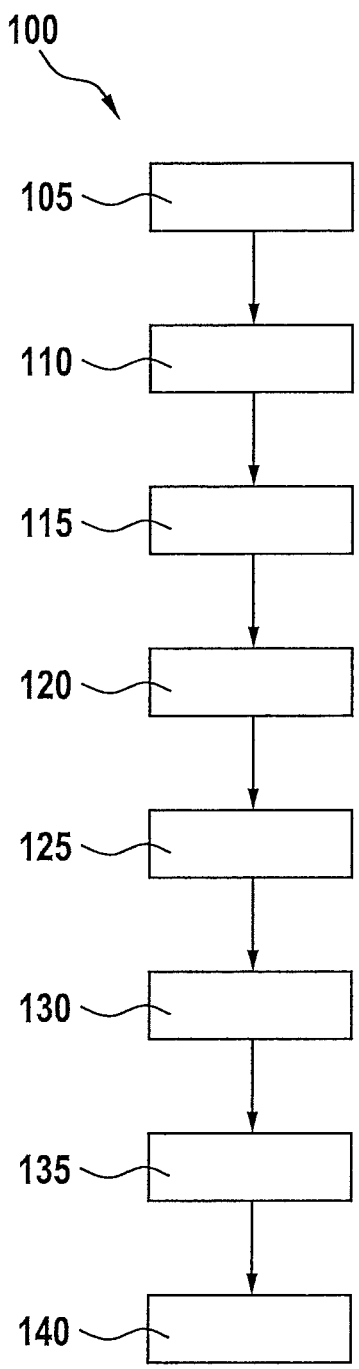

MICROMECHANICAL COMPONENT HAVING A BOND JOINT

RELATED APPLICATION INFORMATION

The present application claims priority to and the benefit of German patent application no. 10 2012 219 616.1, which was filed in Germany on Oct. 26, 2012, the disclosure of which is incorporated herein by reference.

FIELD OF THE INVENTION

The present invention relates to a micromechanical component. The present invention relates in particular to a micromechanical component having a connection for joining with the aid of bonding and to a method for manufacturing the micromechanical component.

BACKGROUND INFORMATION

A known micromechanical component is situated in a housing. The micromechanical component is secured with the aid of a casting compound which, after curing, hermetically encapsulates the micromechanical component in the housing or forms the housing. Prior to casting, electrical connections are established between the'component and external or internal connections of the housing with the aid of bonding. The micromechanical component includes so-called bond pads for this purpose for producing a eutectic bond joint.

On occasion, the encapsulation of the micromechanical component by the casting compound in the region of the bond pads is not perfect, so that parasitic resistances or capacitances may form between adjoining bond pads. This may result in measuring errors during operation, which due to the low currents or charges which are exchanged via the connections of the micromechanical component are generally no longer possible to eliminate.

SUMMARY OF THE INVENTION

It is an object of the present invention to provide an improved micromechanical component which does not have this drawback. Another object of the present invention is to provide a method for manufacturing such a micromechanical component.

The present invention achieves these objects with the aid of a micromechanical component and a manufacturing method for the micromechanical component having the features described herein. Also shown are further specific embodiments.

A micromechanical component according to the present invention includes a substrate and a first oxide layer on the substrate, the first oxide layer having an aperture. The component further includes a conductive functional layer, which is provided on the first oxide layer in the region of the aperture, and a metal layer, which is provided on the functional layer, to produce a bond joint. A second oxide layer is provided on lateral faces of the functional layer for insulating the functional layer.

The second oxide layer may prevent a parasitic capacitance or a parasitic resistance from forming with another electrical element, in particular an adjoining connection with a metal layer. In a micromechanical sensor which includes the micromechanical component, improved measuring accuracy may thus be achieved. The described configuration may advantageously be used in an integrated sensor, in which the micromechanical component has an entirely passive configuration and an active integrated circuit is connected to the micromechanical component with the aid of the bond joint for controlling and evaluating signals of the micromechanical component. The currents or voltages transmitted from and to a passive micromechanical component may be very low, so that even the smallest parasitic resistances or capacitances on connections may negatively influence measuring accuracy.

In one specific embodiment, the functional layer is embedded in a casting compound. Due to the described configuration of the micromechanical component, the casting compound no longer has to have full and impurity-free contact with the functional layer. Due to the second oxide layer, even a detachment of the cured casting compound in the region of the functional layer leading to the metal layer does not necessarily result in the formation of a parasitic capacitance or a parasitic resistance which influences currents exchanged via the functional layer.

The functional layer leading to the metal layer may be separated on all sides from the casting compound by the first oxide layer, the second oxide layer and the metal layer. The parasitic effects mentioned above may thus be avoided, and corrosion of the functional layer due to impurities of the casting compound may be prevented.

The micromechanical component may further include a seismic mass, whose upper edge ends with the upper edge of the functional layer, the seismic mass being made of the same material as the functional layer. This allows the seismic mass and the functional layer leading to the metal layer to be manufactured from the same raw material. A manufacturing process of the micromechanical component may be complicated only insignificantly by the additional application of the second oxide layer.

A method according to the present invention for manufacturing a micromechanical component includes the steps of providing a substrate having a first oxide layer, the first oxide layer having an aperture, and a functional layer, which is provided on the first oxide layer in the region of the aperture; generating a trench in the functional layer in the region around the aperture; and filling the trench with a second oxide layer. Optionally, a portion of the functional layer on an outer side of the second oxide layer may thereafter also be removed.

The method may be embedded without difficulty into a known method for manufacturing a conventional micromechanical component.

In one specific embodiment, the trench is filled with the second oxide layer with the aid of plasma-assisted chemical vapor deposition. Such a method step may already be used in an embedding method, for example for applying the first oxide layer to the substrate, so that a production arrangement (s) used to manufacture the micromechanical component may be reused. Due to the assistance from the plasma, the chemical vapor deposition may additionally be carried out at considerably lower temperatures than in the absence of the plasma, whereby the previously created structures of the component may be protected.

In one specific embodiment, a coating layer on the functional layer is removed after the trench has been filled, and a metal layer for producing a bond joint is arranged on the functional layer remaining in the region over the aperture. The step of removing a portion of the functional layer on the outer side of the second oxide layer, which is carried out later, may be easier to carry out since the functional layer is already protected on all sides by passivating layers, so that the removal, for example with the aid of reactive ion etching, is no longer able to negatively act on the electrical connection between the substrate and the metal layer.

The coating layer may be removed with the aid of grinding or etching. It may thus be assured that an upper edge of the functional layer is flat or planar, so that additional structures of the micromechanical component may be produced in an improved manner.

In one particular specific embodiment, the trench is generated with the aid of reactive ion etching. For this purpose, in particular the Bosch process (reactive ion etching, RIE) or deep reactive ion etching (DRIE) may be used. This allows the trench to be relatively narrow, for example having a width of approximately 1 μm to 2 μm, while also being sufficiently deep to reach the first oxide layer. The thickness of the functional layer between the substrate and the metal layer may thus be sufficiently large to enable a seismic mass or another sensor structure having sufficient expansion or sufficient mass to be produced from the functional layer.

The micromechanical component may include a seismic mass, which is also produced from the functional layer. Etching and deep etching methods may again be used for this purpose.

The present invention will be described in greater detail hereafter with reference to the accompanying drawings.

BRIEF DESCRIPTION OF THE DRAWINGS

FIG. 1 shows a flow chart of a method for manufacturing a micromechanical component.

DETAILED DESCRIPTION

FIG. 1 shows a flow chart of a method 100 for manufacturing a micromechanical component. The method 100 shows only some of the steps which may be required to manufacture the entire micromechanical component. Steps not shown relate in particular to the formation of mechanical, i.e., movable, structures of the micromechanical component. However, these steps are known in the related art, so these will not be addressed in detail here.

To illustrate the steps of the method 100, reference is made hereafter to FIGS. 2A through 2H, which show a micromechanical component 200 in various stages of its manufacture.

Figure 2A:
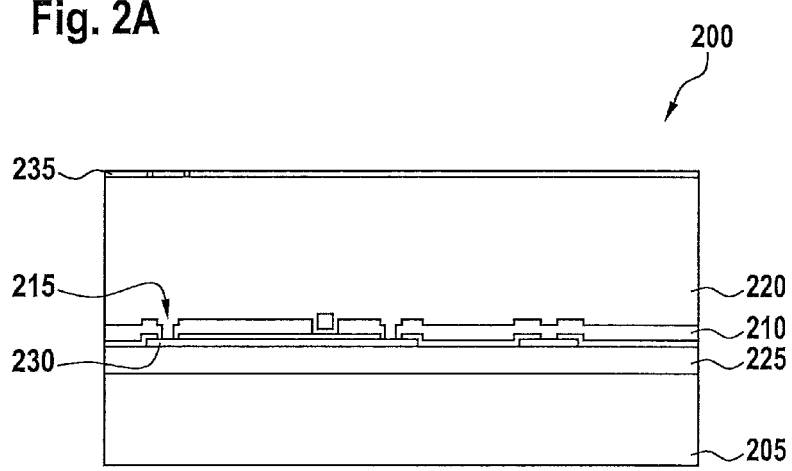
FIGS. 2A, 2B, 2C, 2D, 2E, 2F, 2G, and 2H show the micromechanical component of FIG. 1 in various stages of its manufacture.

In a first step 105, component 200 is provided in a stage which is visible in FIG. 2A. A first oxide layer 210 having a vertical aperture 215 is located on a substrate 205. A functional layer 220 is provided on first oxide layer 210, so that aperture 215 is covered in the vertical direction. Substrate 205 and functional layer 220 are usually made of polycrystalline silicon, while first oxide layer 210 is made of a dielectric, for example silicon dioxide.

Further layers are usually applied in predefined structures between first oxide layer 210 and substrate 205 and may be insulated from each other with the aid of non-conductive structures. These structures usually have the task of acting as electrical connecting tracks. In the illustration of FIG. 2A, an insulating intermediate layer 225 is situated on substrate 205, a conductive connecting layer 230 being provided on a section of intermediate layer 225. Connecting layer 230 is located beneath aperture 215 of first oxide layer 210, so that a conductive connection exists between functional layer 220 and connecting layer 230.

A mask 235 is also applied to the upper face of functional layer 220 in step 105. Mask 235 covers only portions of functional layer 220 and may be applied with the aid of photolithography, for example. Illustrated mask 235 leaves regions around aperture 215 open, so that these may be exposed to an etching process, from which mask 235 protects other portions of the existing structures.

Figure 2B:
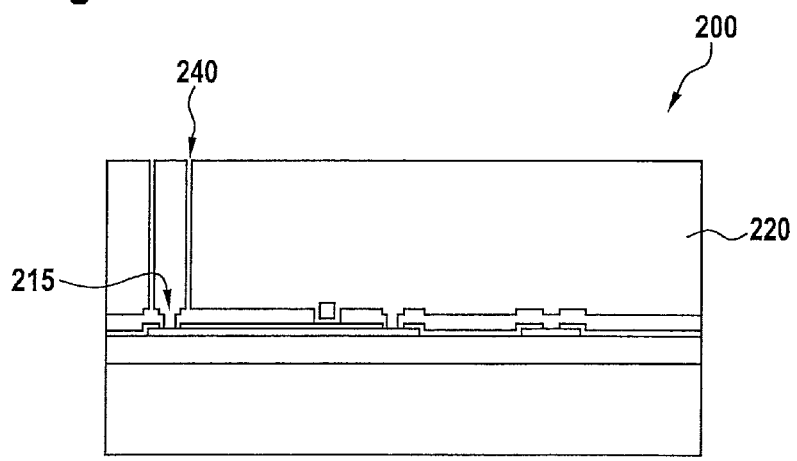

In a step 110, a trench 240 is introduced into functional layer 220 (see FIG. 2B). This process is also referred to as "entrenchment" and may be carried out with the aid of ion etching or deep ion etching. In the illustration of FIG. 2B, trench 240 surrounds aperture 215 and extends vertically up to first oxide layer 210, so that the column of material of functional layer 220, which is created as a result of trench 240 over aperture 215, is separated from the remaining material of functional layer 220.

Figure 2C:
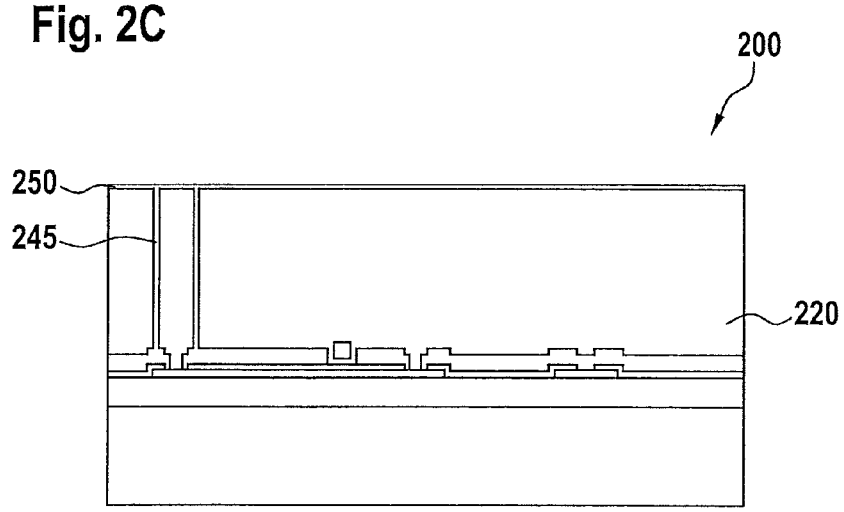

In a subsequent step 115, trench 240 is filled with an insulator, as is shown in FIG. 2C. Filling may be carried out with the aid of chemical vapor deposition (CVD), and in particular with the assistance of plasma. An insulating layer, for example a second oxide layer 245 made of silicon dioxide, is deposited in trench 240. During deposition, a gas phase penetrates into trench 240 and settles on surfaces of trench 240 until trench 240 is ultimately filled with second oxide layer 245. However, second oxide layer 245 usually also forms a coating layer 250 on the upper faces of other exposed structures, for example on the upper face of functional layer 220.

In a step 120, coating layer 250 is removed from the upper face of functional layer 220 if needed. The removal may be carried out with the aid of etching or grinding, for example. This ends the sequence of steps 105 through 120 which are additionally carried out as compared to a conventional manufacturing method for a micromechanical component 200. To provide a better understanding, the following steps for producing a contacting possibility on the micromechanical component 200 will be described hereafter.

Figure 2D:
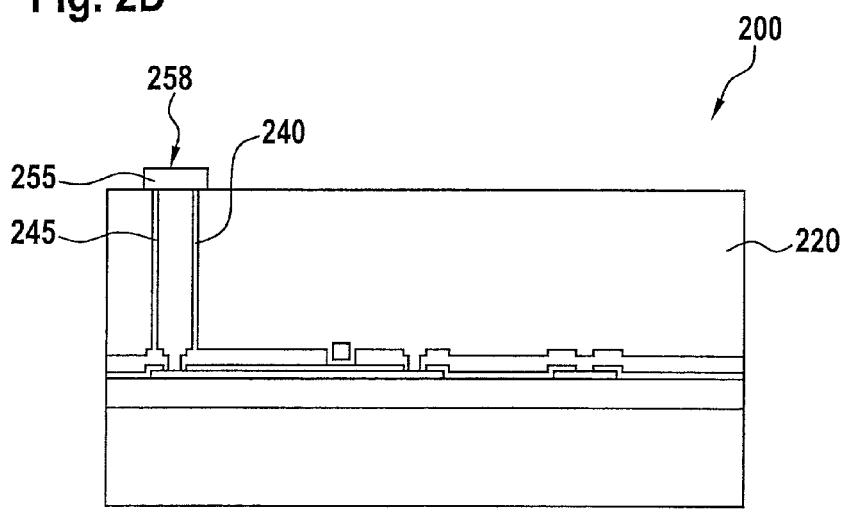

In a step 125, as is shown in FIG. 2D, a metal layer 255 has been applied to functional layer 220 in the region of the previously created column. Metal layer 255 completely covers the region enclosed by trench 240 and trench 240 may be filled with second oxide layer 245 in the vertical direction. Metal layer 255 usually includes aluminum and may be used later for producing a eutectic bond joint for contacting micromechanical component 200. This completes a connection 258, which is provided for electrically contacting micromechanical component 200 and which includes metal layer 255, the section of functional layer 220 which is enclosed by trench 240, and second oxide layer 245 provided laterally on this section. In one variant, first oxide layer 210 may also be considered to be part of connection 258.

Figure 2E:
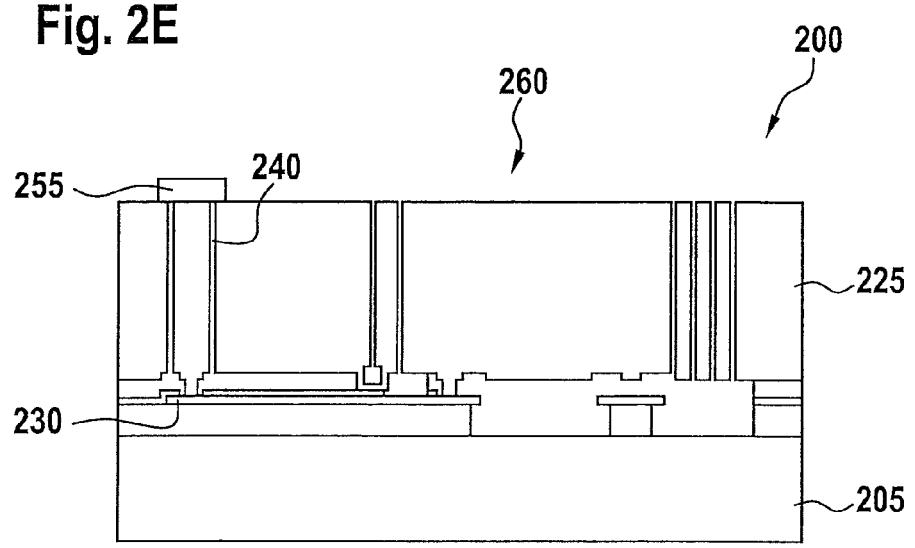
Figure 2F:
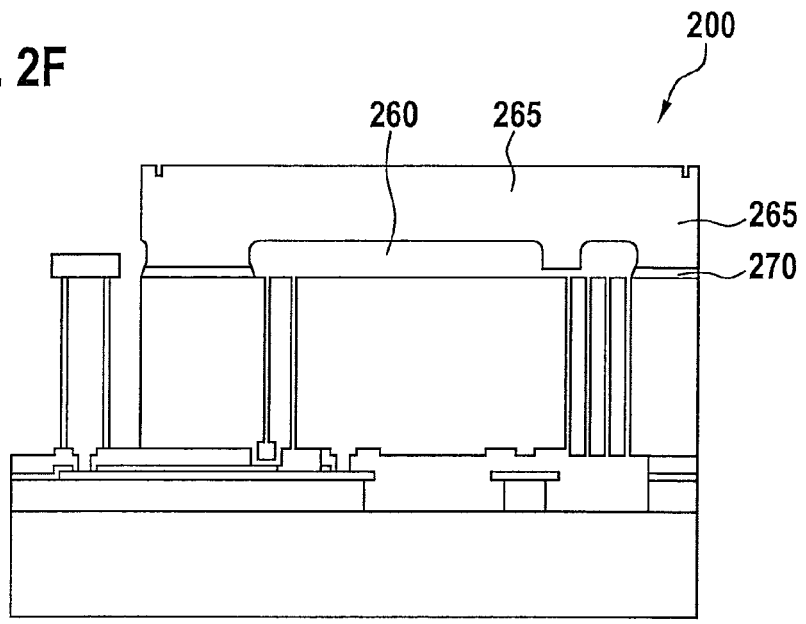

In a step 130, which is illustrated in FIG. 2E, gas phase etching of functional layer 225, and optionally of further layers ("sacrificial layers"), which are located between functional layer 225 and substrate 205, is carried out. Illustrated micromechanical component 200 forms part of an inertial sensor by way of example and includes a seismic mass 260, which is produced from functional layer 225 in such a way that it may be elastically moved with respect to substrate 205 in a predefined manner. Contactless structures on seismic mass 260 and the remaining functional layer 225 allow an electrical signal to be provided as a function of a deflection or the movement of seismic mass 260 relative to substrate 205. By way of example, seismic mass 260 is electrically connected to metal layer 255 in FIG. 2E via connecting layer 230 and the region of connecting layer 225 enclosed by trench 240.

In step 130, optionally also regions of functional layer 225 located on an outer side of trench 240 are removed, so that the previously created column is standing freely.

In an optional step 135, a cap 265 is put onto regions of functional layer 225 to protect seismic mass 260. In one specific embodiment, cap 265 is joined to functional layer 225 with the aid of a glass layer 270. During this step, the space in which seismic mass 260 is located may be pressurized to a predetermined negative pressure.

Figure 2G:
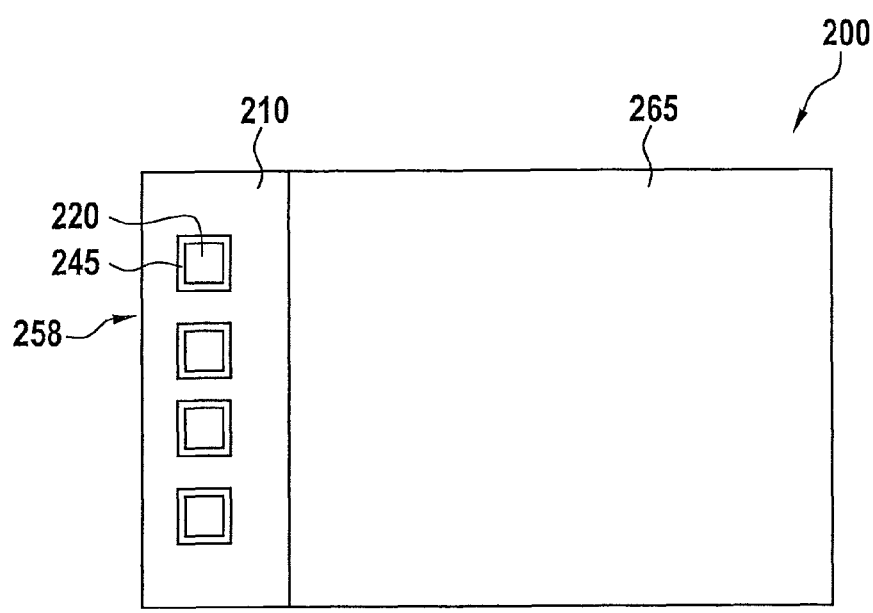

After cap 265 has been put on, micromechanical component 200 looks from above as shown in FIG. 2G. To provide a better understanding, metal layer 255 is not illustrated. In the left region of the illustration four squares are visible, which each represent an electrical connection 258 for micromechanical component 200. In other specific embodiments, other cross-sections than square ones may also be selected for the connections. An inner conductive region of each connection 258 is composed of a section of functional layer 220, this section being enclosed on the outside on all sides by second oxide layer 245. Second oxide layer 245 adjoins first oxide layer 210 in a direction remote from the observer.

Figure 2H:
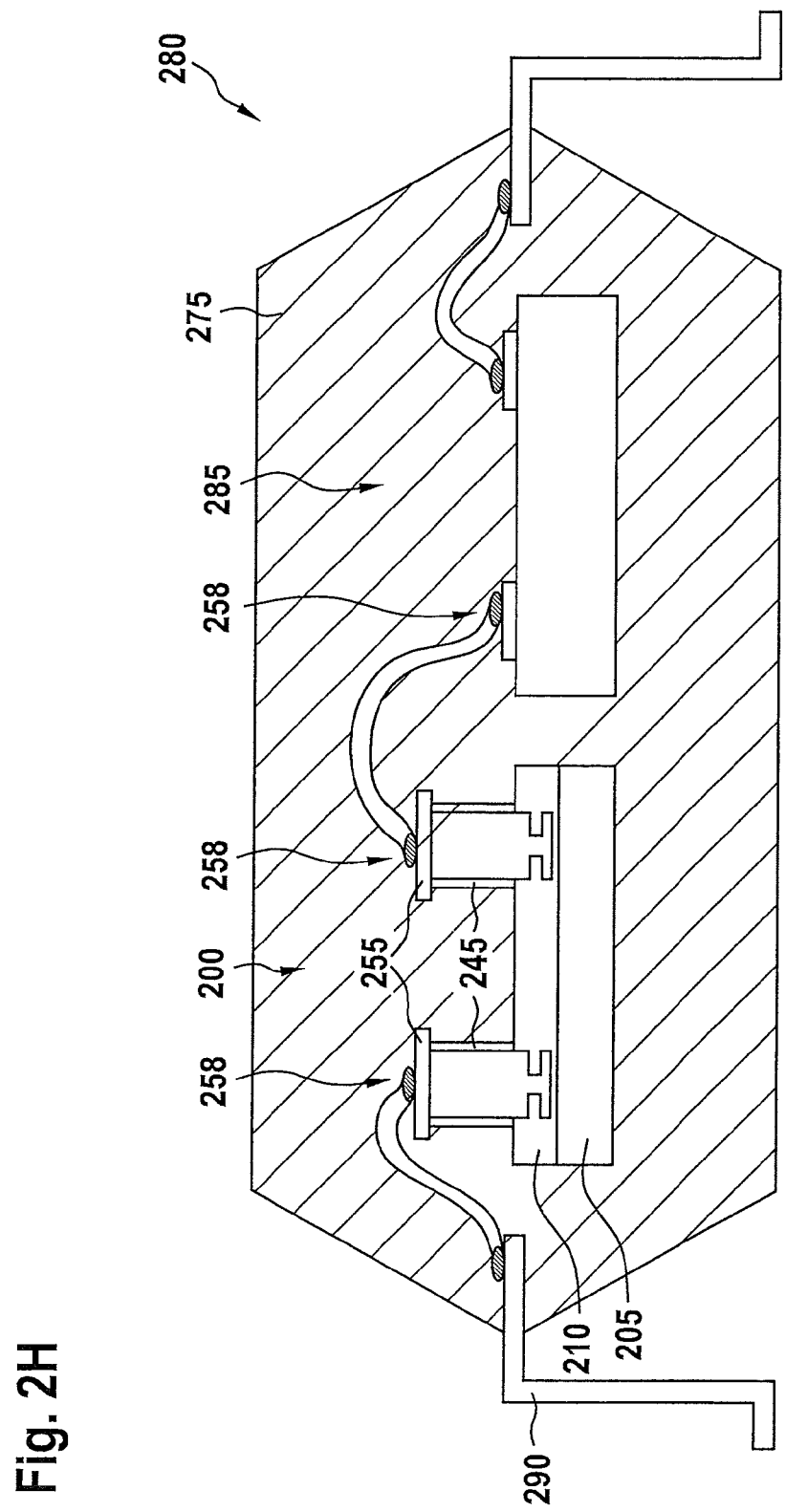

In a final step 140, micromechanical component 200 is optionally cast with the aid of a casting compound 275, as is shown in FIG. 2H by way of example. Casting compound 275 forms a housing of an integrated circuit 280. The housing may have a standardized form having standardized dimensions, for example in the form of a housing of the type SOIC16W. Integrated circuit 280 may further include a control or evaluation circuit 285, which may be manufactured in a separate process and is also accommodated in the housing. An electrical solder contact 290, accessible from the outside, of integrated circuit 280 is joined to metal layer 255 of one of the connections of micromechanical component 200 with the aid of a bond joint. Another connection 258 of micromechanical component 200 is joined to a connection 258 of circuit 285 with the aid of a further bond joint.

If an impurity is present in the region between the connections of component 200, in particular on the upper face of first oxide layer 210, during the casting of the casting compound 275, or if the joint between casting compound 275 and first oxide layer 210 is not complete in this region, a parasitic resistance or a parasitic capacitance may form between the connections of component 200. If casting compound 275 is detached from first oxide layer 210 in this region, ambient moisture may also collect in the resulting cavity, which may favor electrical interfering effects between the connections of component 200 which are difficult to control.

Such effects may be reduced or suppressed by the lateral insulation of the connections of micromechanical component 200 with the aid of second oxide layer 245. Component 200 may thus be better controlled or scanned and operated with improved accuracy. The way in which second oxide layer 245 is arranged may be less complex than a modified production of the electrical connection 258 on micromechanical component 200, so that connection 258, together with seismic mass 260, may still be worked out of functional layer 220.

What is claimed is:

1. A micromechanical component, comprising:
 a substrate;
 a first oxide layer on the substrate, the first oxide layer having an aperture;
 a conductive functional layer, which is on the first oxide layer in a region of the aperture; and
 a metal layer, which is on the functional layer in the region over the aperture, for providing a bond joint; and
 a second oxide layer on lateral faces of the functional layer for insulating the functional layer, wherein the second oxide layer had been filled in a trench in the functional layer in the region around the aperture.

2. The micromechanical component of claim 1, wherein the functional layer is embedded in a casting compound.

3. The micromechanical component of claim 2, wherein the functional layer is separated on all sides from the casting compound by the first oxide layer, the second oxide layer and the metal layer.

4. The micromechanical component of claim 1, further comprising:
 a seismic mass, whose upper edge ends with the upper edge of the functional layer, wherein the seismic mass is made of a same material as the functional layer.

5. The micromechanical component of claim 1, further comprising:
 a seismic mass, whose upper edge ends with the upper edge of the functional layer;
 wherein the seismic mass is made of a same material as the functional layer, and
 wherein the functional layer is embedded in a casting compound.

6. The micromechanical component of claim 5, wherein the functional layer is separated on all sides from the casting compound by the first oxide layer, the second oxide layer and the metal layer.

7. A method for manufacturing a micromechanical component, the method comprising:
 providing a substrate having a first oxide layer, the first oxide layer having an aperture, and a functional layer, which is provided on the first oxide layer in a region of the aperture;
 generating a trench in the functional layer in the region around the aperture;
 filling the trench with a second oxide layer for insulating the functional layer;
 removing a coating layer on the functional layer after the trench has been filled; and
 providing a metal layer for producing a bond joint on the functional layer remaining in the region over the aperture.

8. The method of claim 7, wherein the trench is filled with the second oxide layer with the aid of plasma-assisted chemical vapor deposition.

9. The method of claim 7, wherein the coating layer is removed with the aid of grinding or etching.

10. The method of claim 7, wherein the trench is generated with the aid of reactive ion etching.

11. The method of claim 7, wherein a seismic mass of the micromechanical component is produced from the functional layer.

12. The method of claim 7, wherein the trench is filled with the second oxide layer with the aid of plasma-assisted chemical vapor deposition, and wherein the coating layer is removed with the aid of grinding or etching.

13. The method of claim 12, wherein the trench is generated with the aid of reactive ion etching, and wherein a seismic mass of the micromechanical component is produced from the functional layer.

14. The method of claim 7, wherein the trench is generated with the aid of reactive ion etching, and wherein a seismic mass of the micromechanical component is produced from the functional layer.

* * * * *